United States Patent [19]

Malhi

[11] Patent Number: 4,555,843
[45] Date of Patent: Dec. 3, 1985

[54] METHOD OF FABRICATING DENSITY INTENSIVE NON-SELF-ALIGNED STACKED CMOS

[75] Inventor: Satwinder D. S. Malhi, Garland, Tex.

[73] Assignee: Texas Instruments Incorporated, Dallas, Tex.

[21] Appl. No.: 604,804

[22] Filed: Apr. 27, 1984

[51] Int. Cl.[4] ............... H01L 21/88; H01L 21/20; H01L 21/283

[52] U.S. Cl. .................. 29/571; 29/576 J; 148/DIG. 164; 357/23.7; 357/42

[58] Field of Search ............ 29/571, 576 J, 577 C; 148/DIG. 164; 357/23.7, 42, 59

[56] References Cited

U.S. PATENT DOCUMENTS 4,467,518  8/1984  Bansal et al. ................ 29/571
4,476,475 10/1984  Naem et al. ................ 357/42 X

OTHER PUBLICATIONS

Robinson, A. L. et al., "A Fully-Self-Aligned Joint--Gate CMOS Technology" in IEEE International Electron Devices Meeting, Technical Digest, Dec. 1983, pp. 530–533.

Primary Examiner—Brian E. Hearn
Assistant Examiner—Alan E. Schiavelli
Attorney, Agent, or Firm—Carlton H. Hoel; Douglas A. Sorensen; Robert Groover, III

[57] ABSTRACT

A stacked CMOS structure is disclosed which uses buried N++ source and drain for the non-self-aligned bulk N-channel driver devices together with an oversized polygate on which a non-self aligned P-channel load device is made from a second layer of poly or recrystallized poly. The non-self aligned pair of stacked devices provides increased density of devices per unit area with a simple process at the cost of increased gate to source and gate to drain parasitic capicitances.

5 Claims, 17 Drawing Figures

METHOD OF FABRICATING DENSITY INTENSIVE NON-SELF-ALIGNED STACKED CMOS

BACKGROUND OF THE INVENTION

This invention relates to semiconductor electronic devices, and, more particularly, to stacked CMOS devices.

Complementary MOS (CMOS) logic is an important and well known semiconductor technology; CMOS consumes less stand-by power than any other MOS logic configuration. However, this advantage is gained at the expense of substrate area per logic unit. Thus many efforts have been made to increase the packing density of CMOS devices, including the scaling down of device dimensions, and the stacking of devices to save substrate area.

The scaling down of device dimensions cannot be made arbitrarily; rather, scaling rules apply in order to preserve device characteristics. For example, the channel length to width ratio is proportional to the resistive impedance of a MOS device. See, for example, Mead and Conway, Introduction to VLSI Systems (1980) and Enomoto et al, Design Fabrication and Performance of Scaled Analog IC's, IEEE Journal of Solid-State Circuits, Vol. SC-18, pp 395–402 (1983).

Another way of increasing the density of devices on a substrate on constant area would be to stack active layers upon each other and build devices into them. Recent technqiues of laser recrystallizing polysilicon have allowed the fabrication of stacked CMOS devices using a common gate. Such devices are basically fabricated by depositing n-type polysilicon over a standard n-channel device, laser recrystallizing the polysilicon near and overlying the gate of the n-channel device, followed by p+ source/drain doping in the polysilicon to form a p-channel device controlled by the same gate as the n-channel device. See, for example, Colinge et al, Stacked Transistor CMOS (ST-MOS) and NMOS Technology Modified to CMOS, IEEE Journal Solid-State Circuits, Vol. SC-17, pp. 215–219 (1982). Due to the vertical stacking of such devices, such circuits are potentially denser by about a factor of two. Also, there is no parasitic pnpn structure such as one finds in conventional bulk CMOS, and stack CMOS circuits are free of latchup problems.

Nevertheless, when such stacked CMOS circuits are scaled down, the alignment of the channel of the overlying polysilicon p-channel device becomes a problem. In particular, the underlying n-channel is normally fabricated by first forming the gate poly and then diffusing the source and drain regions with the gate acting as a mask; this yields a self-aligned device. For the overlying p-channel polysilicon device, however, the gate is underneath the polysilicon and cannot be used as a mask when the source and drain are being diffused. Thus the alignment of a photolithographic mask becomes crucial. For example, if the overlying p-channel device is to have a channel length of L and the error in mask alignment is S, then the gate must be of width at least L+2S to insure the channel of the p-channel device being entirely over the gate. However, if the gate has a width of L+2S then the self-aligned n-channel device will have a channel length of L+2S neglecting small lateral diffusion underneath the gate. And as the device dimensions are scaled down the error in mask alignment may almost eliminate the saving from stacking. Indeed, if the channel length L were to be 1.0 microns and the mask alignment error S were 0.5 microns then the n-channel length would be 2 microns; i.e. twice as long as desired. Further, the width of the n-channel would be twice as wide as desired to maintain the same length to width ratio. In effect, the n-channel would occupy four times as much area as desired.

Attempts to solve this alignment problem for stacked CMOS have been made. For example, A. L. Robinson et al, A Fully-Self-Aligned Joint-Gate CMOS Technology, IEDM Technical Digest, pp. 530–533, 1983, claims, a process, but the processing steps are not simple and the solution is not all together satisfactory since in scaling the device down the bulk silicon device is still a problem because a lithographic step is used on top the stack to pattern and then etch the source and drain extensions. The limitations imposed by the lithographic step are entirely similar to the other non-self-aligned approach discussed above.

Thus, it is a problem with the prior art to scale down stacked CMOS devices while substantially retaining the savings in the substrate area as the feature size approaches the patterning alignment error.

SUMMARY OF THE INVENTION

A preferred embodiment of the present invention provides a stacked CMOS device together with a method of fabrication that forms the source and drain diffusions of the underlying device prior to formation of the gate and overlying device. Thus, the underlying device is not self aligned, but its channel length is not dictated by the overlying device's channel length and patterning alignment errors. These stacked devices are narrower because the shorter channel of the underlying device implies a narrower channel to preserve the length-to-width ratio. This narrowing of the stacked devices helps preserve the substrate area gained as the device features are scaled down. Further, the fabrication steps are simple and use already available techniques. Thus, problems of the prior art for scaling down the stacked CMOS are solved.

DETAILED DESCRIPTION OF THE PREFERRED EMBODIMENT

Figure 1A:
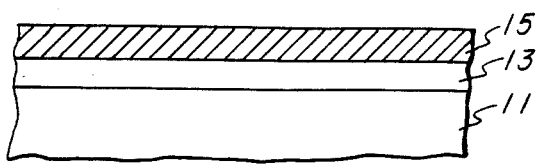
FIGS. 1a–e and 2a–e are schematic representations of the process steps of the prior art showing cross sections plus a plan view of the stacked devices.
Figure 1B:
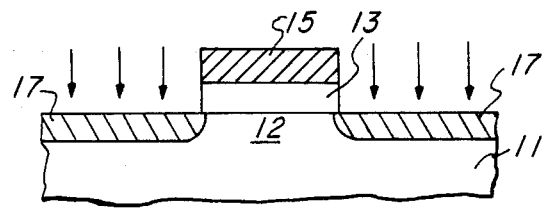
Figure 1C:
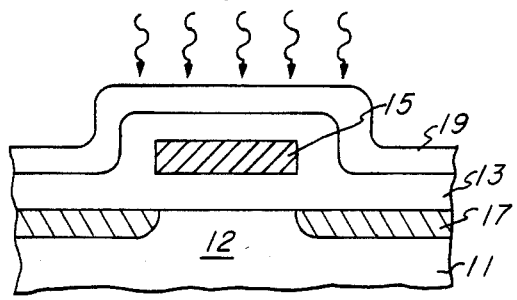

The preferred embodiments of the invented apparatus and method are most easily understood and described by first considering the prior art problem and the prior art solution of the specific context. Thus presume that a p-channel MOS device with channel length L and channel width W is to be fabricated stacked on an n-channel device also with channel length L and channel width W; the two devices are to have a common gate. FIGS. 1 and 2 illustrate the process steps and resultant devices when a p-channel device is stacked on a n-channel device using standard process steps, including mask alignment. In particular, FIG. 1a shows a p-type substrate 11 after growth of oxide layer 13 and deposition of first polysilicon layer 15; the oxide may be grown by thermal oxidation, and the polysilicon deposited by LPCVD. Next the polysilicon 15 is doped using standard phosphorous predeposition; the gate is then patterned and an arsenic implant made to form the n+ source and drain regions 17 (See FIG. 1b where the arsenic implantation is indicated by the arrows).

Figure 1D:
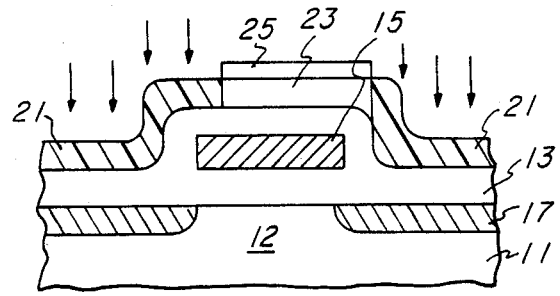
Figure 1E:
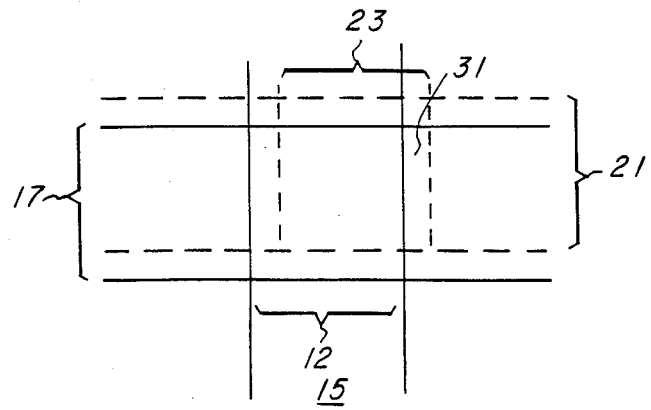
Figure 2A:
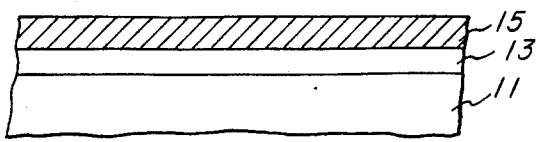
Figure 2B:
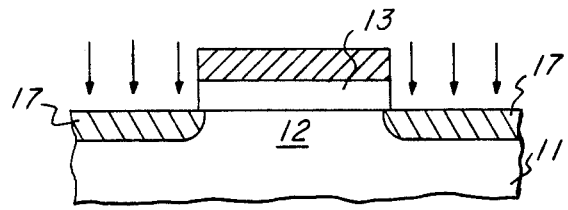
Figure 2C:
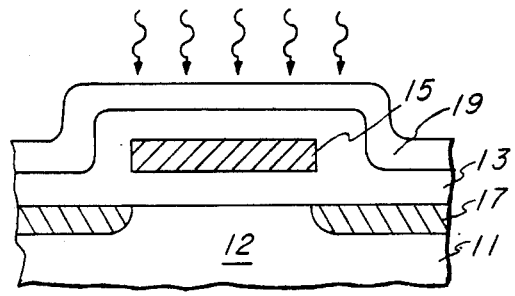
Figure 2D:
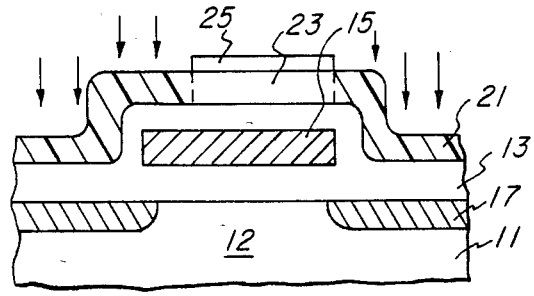
Figure 2E:
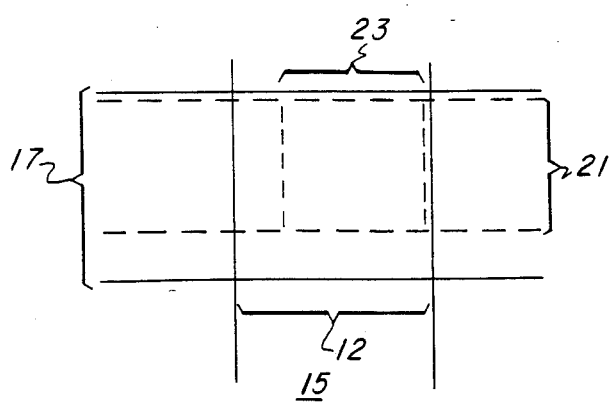
Figure 3A:
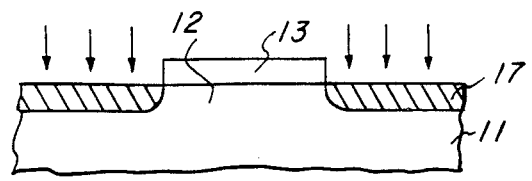
FIG. 3a–e is a schematic representation of a preferred embodiment of the method showing the cross sections plus a plan view of a preferred embodiment of the stacked devices.
Figure 3B:
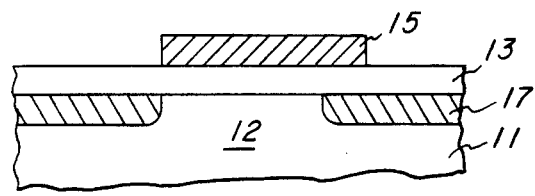
Figure 3C:
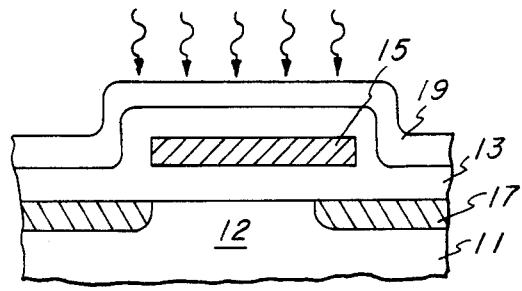
Figure 3D:
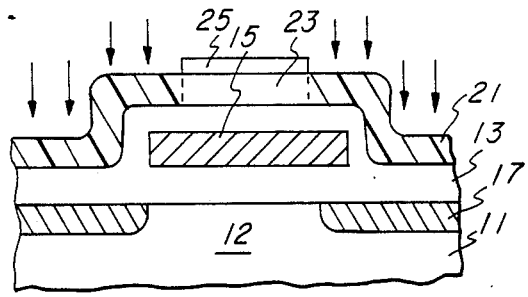
Figure 3E:
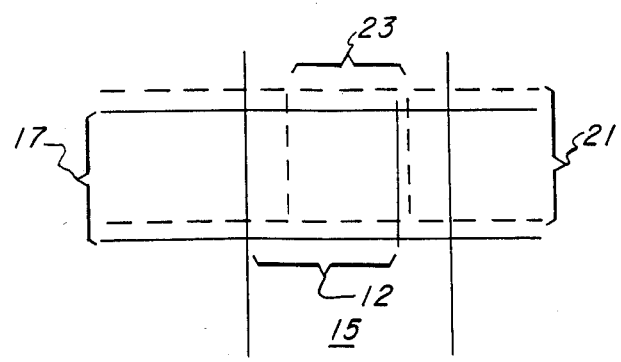

The second gate oxide is grown contiguous to existing gate oxide 13 and thereby isolating polysilicon 15 which will form the gate common to both the p-channel and n-channel devices; this oxide will also be designated 13. A second polysilicon layer 19 is deposited, again by LPCVD, on oxide 13; See FIG. 1c. Note that polysilicon layer 19 is frequently laser recrystallied in the regions to form the p-channel and source and drains; this laser induced recrystallization is schematicly indicated by the wavy arrows in FIG. 1c. Lastly, the source and drain 21 of the p-channel device are formed by heavy doping by boron implantation after a masking step. The p-channel 23 is shown still covered by the protective oxide from the masking step. FIG. 1d also illustrates the problem with the foregoing process arising from misalignment of the mask in the last step forming the source and drain regions 21; the mask oxide 25 is shown shifting slightly to the right of channel 15 in FIG. 1d. As a consequence of this alignment error, the p-channel device formed by gate 15, source and drain 21 and p-channel 23 will have very poor performance because gate 15 will not be able to induce conduction along the entire length of channel 23. Of course, this is not a problem with the n-channel device formed by gate 15 n-channel 11 and source and drain 17 because, as shown FIG. 1b, the device is self aligned. FIG. 1e is a schematic plan view of the misalignment of the p-channel 23 and gate 15; in particular, region 31 is the portion of p-channel 23 which is not controlled by gate 15. Note that FIG. 1e also shows a misalignment of the polysilicon layer 19 with respect to the source and drain 17 and n-channel 12, but this misalignment is effectively inconsequential because gate 15 is translation in variant perpendicular to the p and n channels.

FIG. 2 shows the prior art solution to the misalignment problem illustrated in FIG. 1. The process steps of FIG. 2a–d correspond precisely to those steps of FIG. 1a–d, only the dimensions have been modified. See FIG. 2e. In particular, gate 15 is made of width L+2S, where S denotes the maximum mask misalignment and which is presumed to be the same for both direction on the planar surface of substrate 11. Note that FIG. 1e illustrates the misalignment for the masking of polysilicon 19 in the vertical direction and the misalignment of the masking for channel 23 (i.e., for the doping of source and drain 21) in the horizontal direction. Making gate 15 of width L+2S solves the problem of alignment of channel 23 because even if the mask for defining channel 23 is displaced by a distance S from being centered over gate 15, channel 23 will still be entirely over gate 15 due to the extra width of gate 15. See FIG. 2d. However, making gate 15 of width L+2S means that channel 12 is of length L+2S, and to preserve the width to length ratio of the n-channel device, the width of channel 12 and source and drain 17 must be W(L+2S)/L. Consequently, the stacked devices appear as FIG. 2e in plan view. Again the mask for polysilicon 19 has been shown shifted vertical direction and the mask for channel 23 is shown to have been misaligned in the horizontal direction. More basically, no region 31 appears because the target for forming channel 23 was increased in size so gate 15 could not be missed.

A preferred embodiment of the inventive method and resulting stacked device can now be explained with references to FIG. 3. First, rather than forming gate 15, source and drain regions 17 are formed by patterning and to make channel 12 have length L and not L+2S as in FIG. 2. See FIG. 3a. Next gate 15 is formed over channel 12 by patterning and is chosen to have a width L+2S. Of course, this gate patterning may give rise to a misalignment with channel 12, but gate 15 is oversized and the misalignment can be tolerated without affecting the functionality of the device; See FIG. 3b where gate 15 is shown misaligned to the right relative to channel 12.

The remaining processing steps are identical to those of the prior art solution, and channel 23 is fully controlled by gate 15 for the same reason as with the prior art solution: Gate 15 is of width L+2S. See FIGS. 3c–d and 2c–d. The difference from the prior art solution lies in the width of channel 12 and the source and drain regions 17; because channel 12 is only of length L, it has width W rather than W(L+2S)/L. This is illustrated in plan view FIG. 3e.

The advantages of the preferred embodiment method and stacks of devices is now apparent. The active area in substrate 11 occupied by the prior art solution is basically measured by the area of channel 12 and is equal to $(L+2S)W(L+2S)/L$ which can be written as $LW(1+2S/L)^2$. The corresponding calculation for the preferred embodiment stacked devices is $(L+2S)W$ which can be written as $LW(1+2S/L)$. Thus there has been a gain of a factor of $(1+2S/L)$ over the prior art solution. Thus as the feature size (i.e., L) becomes comparable to the mask alignment error (i.e., S), this gate factor becomes significant.

It is recognized that the use of an oversized gate, as in the preferred embodiments, leads to an increase in gate to drain and gate to source parasitic capacitances and thus a slower device; however, the increased density of devices on substrate 11 more than compensates for this in applications such as SRAM where the propagation delays of signals from peripheral circuits to the memory cells is the dominate delay.

Other preferred embodiments still within the scope of the invention are with channel 12 of length less than L because, again, length L of the stacked device's channel 23 does not dictate the length of channel 12. Rather, the oversized gate effectively permits independent selection of the two channel lengths.

Figure 4:
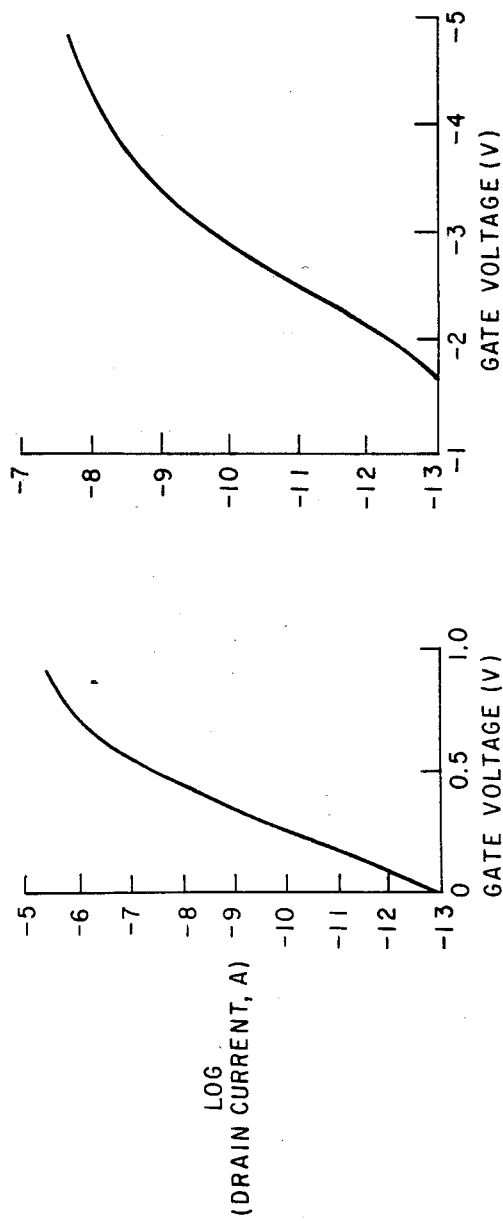
FIG. 4a and b shows electrical characteristics of preferred embodiment stacked devices.

FIG. 4 illustrates the electrical properties of stacked devices with oversized gates. In FIG. 4 the left I-V curve is for the bulk n-channel device with a 1.5 micron channel length, 3.0 micron channel width, and 250 Å thick gate oxide, and the right I-V curve is for the stack p-channel device with a 2.0 micron channel length, 3.0 micron channel width, and 600 Å thick gate oxide; the gate width is about 4 microns.

Variations such as doping levels, enhancement or depletion type device, conduction induced by accumulation or inversion, non-silicon materials, the bulk device being p-channel with the stacked device n-channel, Schottky-barrier source and drain, and so forth are all within the contemplation of the preferred embodiments.

I claim:

1. A method of fabricating stacked field effect semiconductor devices with channel length L, channel width W and with a maximum patterning alignment error S, comprising the steps of:
   (a) patterning first source and drain regions in a semiconductor substrate, said first source and drain regions of width W and defining a first channel region in said substrate of length L and width W,
   (b) forming a first insulating layer on said substrate and covering said first channel region,
   (c) patterning a conducting strip of width of L+2S on said insulating layer, said conducting strip oriented perpendicular to said length L of said first channel region and aligned without regard to S to centrally cover said first channel region,
   (d) forming a second insulating layer on said conducting strip and connecting to said first insulating layer,
   (e) patterning a semiconducting strip of width W on said insulating layers, said semiconducting strip oriented parallel to said length L of said first channel region and aligned without regard to S to cover said first channel region,
   (f) patterning second source and drain regions in said semiconducting strip, said second source and drain regions defining a second channel region of length L oriented perpendicular to said conducting strip and aligned without regard to S to be centrally over said conducting strip, and
   (g) said first source and drain regions, said first channel region, and said conducting strip forming a first field effect semiconductor device, and said second source and drain regions, said second channel region, and said conducting strip forming a secnd field effect semiconducting device stacked on said first device.

2. A method of fabricating stacked field effect semiconductor devices with channel length L, channel width W, in the underlying device, channel length K, channel width V in the overlying device, and with a maximum patterning alignment error S, comprising the steps of:
   (a) patterning first source and drain regions in a semiconductor substrate, said first source and drain regions of width W and defining a first channel region in said substrate of length L and width W,
   (b) forming a first insulating layer on said substrate and covering said first channel region,
   (c) patterning a conducting strip of width at least the larger of L+2S and K+2S on said insulating layer, said conducting strip oriented perpendicular to said length L of said first channel region and covering said first channel region,
   (d) forming a second insulating layer on said conducting strip and connecting to said first insulating layer,
   (e) patterning a semiconducting strip of width V on said insulating layers, said semiconducting strip oriented parallel to said length L of said first channel region and at least partially covering said first channel region,
   (f) patterning second source and drain regions in said semiconducting strip, said second source and drain regions defining a second channel region of length K and width V and oriented perpendicular to said conducting strip and over said conducting strip, and
   (g) said first source and drain regions, said first channel region, and said conducting strip forming a first field effect semiconductor device, and said second source and drain regions, said second chanel region, and said conducting strip forming a second field effect semiconducting device stacked on said first device.

3. The method of claim 2, wherein:
   (a) said semiconductor substrate comprises crystalline silicon, and
   (b) said semiconducting strip comprises polycrystalline silicon.

4. The method of claim 2, wherein:
   (a) said first device is a n-channel device, and
   (b) said second device is a p-channel device.

5. The method of claim 4, wherein:
   (a) said p-channel device operates as a depletion mode device, and
   (b) said n-channel device operates as an enhancement mode device.

* * * * *